(12) United States Patent
Kuit et al.

(10) Patent No.: US 8,854,598 B2
(45) Date of Patent: Oct. 7, 2014

(54) LITHOGRAPHIC APPARATUS AND DEVICE MANUFACTURING METHOD

(75) Inventors: Jan-Jaap Kuit, Veldhoven (NL); Doede Frans Kuiper, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1052 days.

(21) Appl. No.: 12/499,595

(22) Filed: Jul. 8, 2009

(65) Prior Publication Data

US 2010/0020296 A1  Jan. 28, 2010

Related U.S. Application Data

(60) Provisional application No. 61/129,826, filed on Jul. 22, 2008.

(51) Int. Cl.
*G03F 7/20* (2006.01)

(52) U.S. Cl.
CPC ........ *G03F 7/70875* (2013.01); *G03F 7/70508* (2013.01); *G03F 7/707* (2013.01); *G03F 7/70775* (2013.01)
USPC ................... 355/30; 355/53; 355/72; 355/75; 355/77

(58) Field of Classification Search
USPC ........................ 355/30, 52, 53, 55, 72–76, 77; 250/492.1, 492.2, 492.22, 493.1, 548
See application file for complete search history.

(56) References Cited

U.S. PATENT DOCUMENTS

| | | | | |
|---|---|---|---|---|
| 4,503,335 A | * | 3/1985 | Takahashi | 250/548 |
| 4,564,284 A | * | 1/1986 | Tsutsui | 355/30 |
| 5,325,180 A | * | 6/1994 | Chappelow et al. | 356/401 |
| 5,894,056 A | * | 4/1999 | Kakizaki et al. | 430/5 |
| 6,645,701 B1 | * | 11/2003 | Ota et al. | 430/311 |

(Continued)

FOREIGN PATENT DOCUMENTS

| | | |
|---|---|---|
| JP | 2006-074961 A | 3/2006 |
| JP | 2007116148 | 5/2007 |
| JP | 2009516932 T | 4/2009 |
| WO | 2008072031 A | 6/2008 |

OTHER PUBLICATIONS

Office Action in related Japanese Application No. 2009-166220 mailed Jun. 27, 2011.

(Continued)

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A lithographic apparatus having an illumination system configured to condition a radiation beam, a support constructed to support a patterning device, the patterning device being capable of imparting the radiation beam with a pattern in its cross-section to form a patterned radiation beam, a substrate table constructed to hold a substrate; a projection system configured to project the patterned radiation beam onto a target portion of the substrate; and, an actuator arranged to exert a force on an object, wherein the apparatus includes a thermal expansion error compensator configured to avoid an error caused by thermal expansion of the object by any heat dissipated by the actuator or another heat source.

27 Claims, 2 Drawing Sheets

(56) References Cited

U.S. PATENT DOCUMENTS

| | | | |
|---|---|---|---|
| 2001/0055102 A1* | 12/2001 | Emoto | 355/53 |
| 2004/0240513 A1* | 12/2004 | del Puerto | 374/44 |
| 2005/0088634 A1* | 4/2005 | Kosugi et al. | 355/30 |
| 2005/0140950 A1* | 6/2005 | Franken et al. | 355/53 |
| 2007/0076180 A1* | 4/2007 | Tinnemans et al. | 355/53 |
| 2007/0114655 A1* | 5/2007 | Hol et al. | 257/714 |
| 2007/0216892 A1* | 9/2007 | Eidelberg | 355/72 |
| 2009/0059199 A1* | 3/2009 | Kuit et al. | 355/73 |

OTHER PUBLICATIONS

Chinese Office Action dated Sep. 1, 2011 in corresponding Chinese Patent Application No. 200910151115.X.

* cited by examiner

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application No. 61/129,826, entitled "Lithographic Apparatus and Device Manufacturing Method", filed on Jul. 22, 2008. The content of that application is incorporated herein in its entirety by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus may be provided with an actuator to position an object. For example, the actuator may position an object, such as a substrate table or a support. To have a fast response time it may be beneficial to mount the actuator with high stiffness to the object. With such stiff mount, thermal expansion by heating up of the actuator may cause deformation of a part of the actuator that is stiffly mounted to the object and thereby deformation of the object itself. Since the object may need to be positioned with high precision a deformation of the object may jeopardize positioning of the object. Heating up may also be caused by other heat sources such as the illuminator beam, other actuators in the assembly, heating elements, fluids flowing through the structure etc.

SUMMARY

It is desirable to provide a lithographic apparatus that is less sensitive to temperature changes.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and an actuator arranged to position an object, wherein the apparatus includes a thermal expansion error compensation system to reduce positioning errors caused by thermal expansion of a part of the actuator coupled to the object by any heat dissipated by the actuator or another heat source.

According to an embodiment of the invention, there is provided a device manufacturing method including transferring a pattern from a patterning device onto a substrate with a lithographic projection apparatus, wherein the method includes positioning with an actuator an object within the apparatus and compensating errors by thermal expansion of a part of the actuator connected to the object by heat dissipated by the actuator or by another heat source with a thermal expansion error compensation system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
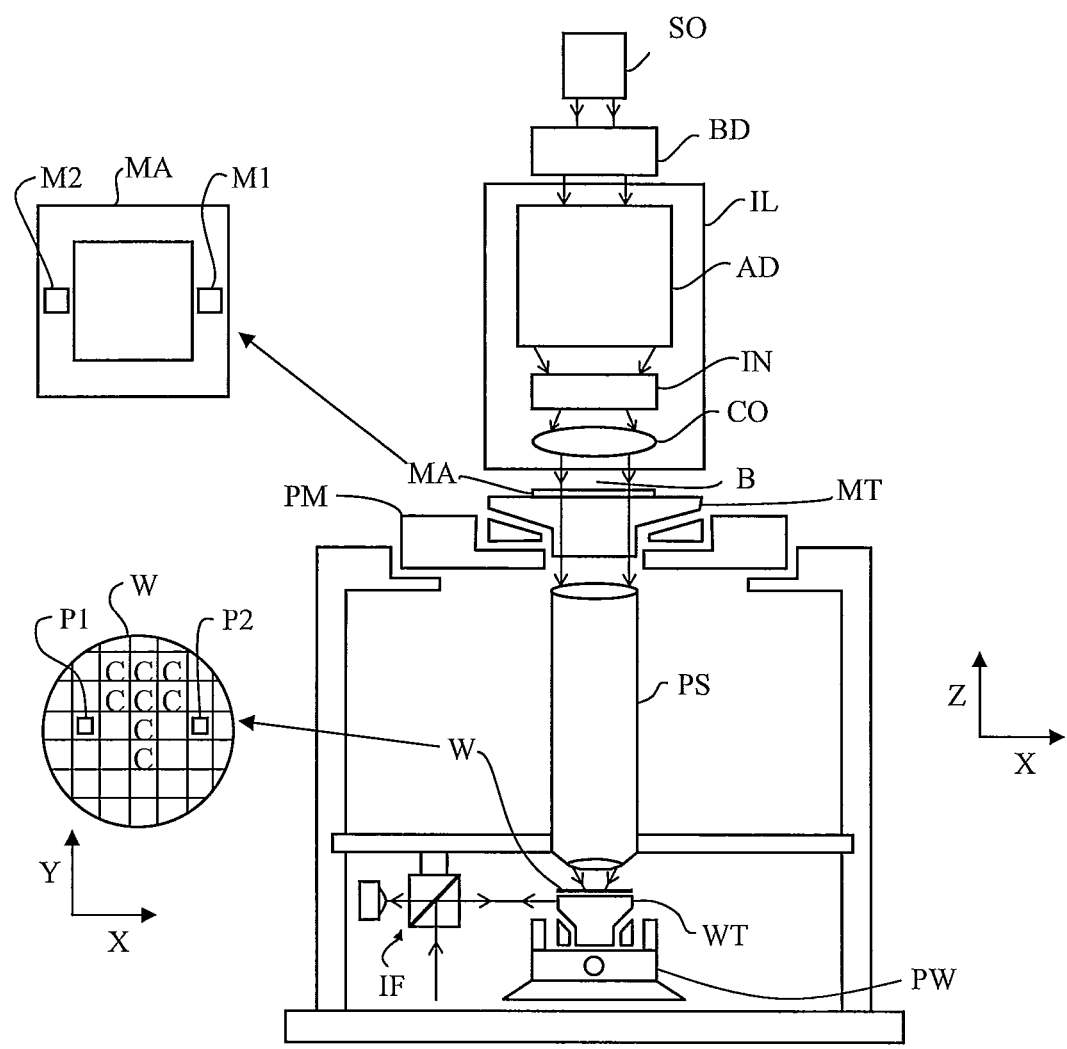
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
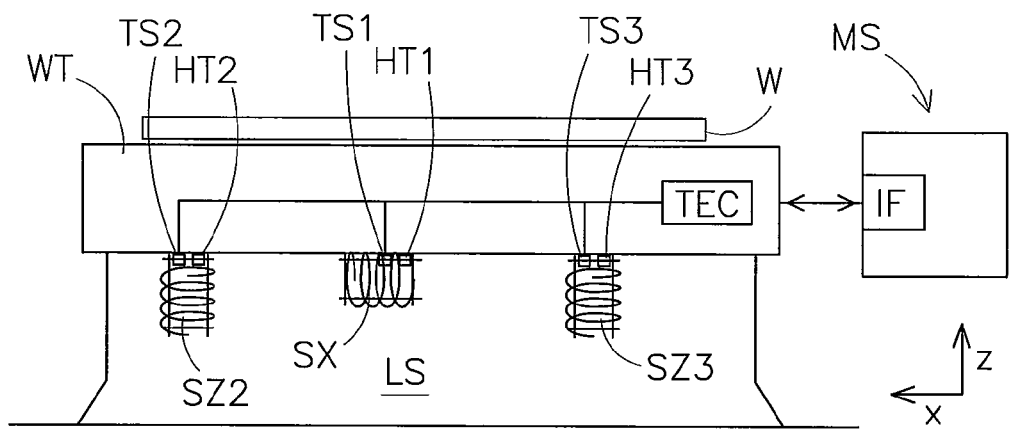
FIG. 2 depicts a substrate stage of the lithographic apparatus of FIG. 1 according to an embodiment of the invention.

FIG. 2 depicts a substrate stage of the lithographic apparatus of FIG. 1 according to an embodiment of the invention. The substrate table WT configured to support a substrate may, for example, be a mirror block and interferometers IF may be used to measure the position of the mirror block in the lithographic apparatus. The substrate table WT may be positioned with the aid of a positioning system PW. The positioning system may include actuators for movements over long ranges and over short ranges. The actuators for short range movements may be short stroke motors SZ2 and SZ3 to actuate the substrate table WT in the Z-direction with respect to a long stroke stage LS moved by the actuator for movements over long ranges. The short stroke motor SX may be used to actuate the mirror block in the X-direction with respect to the long stroke stage LS. The motors for the long range and the short stroke motors may be a Lorenz motor, for example voicecoil motors or planar motors. The parts of the actuators SX, SZ2 and SZ3 that are connected to the mirror block WT may thermally expand when the actuators are used because the actuator may heat up. The thermal expansion may deform the substrate table WT and may cause the interferometer IF provided to the metrology system to measure a wrong position of the substrate table WT. By providing temperature sensors TS1, TS2 and TS3 to the parts of the actuator connected to the substrate table WT the temperature of these parts can be measured. By connecting the temperature sensors to a thermal expansion calculator TEC for calculating the deformation of the substrate table WT the deformation of the substrate table WT caused by heating of the actuators SX, SZ2 and SZ3 can be calculated. The expansion in one or more directions can be send to a metrology system MS, wireless or by a wire not shown in the figure. The metrology system measures a position of the substrate table WT with an interferometer IF. By taking into account the deformation calculated by the thermal expansion calculator with the measurements of the interferometer system IF the position of the substrate table WT can be determined precisely while at the same time the actuators have been connected to the substrate table WT. The temperature sensors TS1, TS2 and TS3 and the thermal expansion calculator TEC are part of the thermal expansion error compensator that is configured to compensate errors caused by thermal expansion of the part of the actuators coupled to the substrate table.

The coupling (e.g. connection) of the actuators is such that some expansion is allowed. By increasing the stiffness of the connection the bandwidth of the servo loop can be increased, resulting in improved accuracy. However, it also means that the forces due to thermal expansion increase, which leads to mechanical deformation and therefore loss of accuracy. Using a thermal expansion calculator some more deformation is allowed and therefore the actuators can be mounted more stiffly to the object enabling a higher bandwidth servoloop with better servo accuracy.

In an embodiment of the invention, the actuators are pre-heated before starting normal operation of the lithographic apparatus. The substrate table WT is for this purpose provided with a temperature adjuster, for example heaters HT1, HT2 and HT3 for adjustment of the temperature of the part of the actuators SX, SZ2 and SZ3, which is connected to the substrate table WT or for adjustment of the temperature of the substrate table itself. By bringing the parts of the actuators that are connected to the substrate table WT already on the operating temperature before starting operation of the apparatus, one can calibrate the metrology system MS already with an expanded part of the actuator connected to the substrate table WT. No additional expansion during operation may then occur so that there is no deformation that may influence the measurements of the metrology system MS during operation. It is desirable to calibrate and use the system at the operating temperature. So, pre-heating is desirable before calibration and before usage. In this embodiment, it may be beneficial to leave the thermal expansion calculator TEC out of the apparatus because when the temperature of the parts of the actuator connected to the substrate table WT is at operating level, there may be only small residual variations in deformation during operation and the static deformation offset can be calibrated with the metrology system MS so that it does not substantially influence the metrology system anymore. In an alternative of this embodiment, additional heaters can be left out of the apparatus by using the actuators SX, SZ2 and SZ3 before operation to exert forces on the substrate table WT so that parts of the actuators connected to the substrate table WT are already heated up to the operation temperature by the actuators before starting normal operation of the apparatus. This pre-heating cycle may then also be done before calibration of the position measurement system.

According to an embodiment of the invention, the temperature measurement system TS1, TS2 and TS3 may be connected to the temperature adjustment system (also termed hereinafter "temperature adjuster") to keep the part of the actuator connected to the substrate table on a constant temperature. By having it at a constant temperature, substantially no thermal expansion will be influencing the part of the actuators connected to the substrate table WT and no additional deformation of the substrate table WT will occur. Also in this embodiment it may be beneficial to leave the thermal expansion calculator TEC out of the apparatus. The constant temperature may be chosen such that it is slightly higher that the normal operating temperature so that no cooling is necessary by the temperature adjuster. The invention can also be used to position the patterning device on the support.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate;
an actuator arranged to position an object; and
a thermal expansion error compensator configured to compensate an error caused by thermal expansion of a part of the actuator coupled to the object by any heat dissipated by the actuator or another heat source, wherein the thermal expansion error compensator includes a temperature measurement system configured to measure a temperature of the part of the actuator and a calculator configured to calculate a deformation of the object resulting from the thermal expansion of the part based on the temperature measurement of the part of the actuator.

2. The lithographic apparatus according to claim 1, further comprising a metrology system configured to control a position, or a shape, or both a position and a shape, of the object and wherein the thermal expansion error compensator is coupled to the metrology system so as to compensate for the error caused by thermal expansion of the part of the actuator.

3. The lithographic apparatus according to claim 2, wherein the thermal expansion calculator is coupled to the metrology system to compensate for the error caused by expansion of the object caused by the expansion of the part of the actuator.

4. The lithographic apparatus according to claim 1, wherein the temperature measurement system is coupled to the part of the actuator coupled to the object.

5. The lithographic apparatus according to claim 1, wherein the thermal expansion error compensator includes a temperature adjuster configured to adjust the temperature of the part of the actuator coupled to the object.

6. The lithographic apparatus according to claim 5, wherein the thermal expansion error compensator includes a temperature measurement system which works together with the temperature adjuster to keep the part at a desired temperature.

7. The lithographic apparatus according to claim 5, wherein the temperature adjuster is a heater configured to heat the part.

8. The lithographic apparatus according to claim 1, wherein the object is the substrate table or a part thereof 9. The lithographic apparatus according to claim 1, wherein the object is the support or a part thereof 10. A device manufacturing method comprising:
transferring a pattern from a patterning device onto a substrate with a lithographic projection apparatus;
positioning an object within the apparatus with an actuator;
measuring the temperature of the part of the actuator coupled to the object; and
compensating an error caused by thermal expansion of a part of the actuator coupled to the object by heat dissipated by the actuator or by another heat source with a thermal expansion error compensator, the compensating including calculating a deformation of the object resulting from the thermal expansion of the part based on the temperature measurement of the part of the actuator.

11. The device manufacturing method according to claim 10, further comprising measuring the temperature within the lithographic apparatus.

12. The device manufacturing method according to claim 10, further comprising controlling a position of the object with a metrology system and compensating the error by compensating for the deformation during controlling the position of the object with the metrology system.

13. The device manufacturing method according to claim 10, further comprising adjusting a temperature of the part of the actuator.

14. The device manufacturing method according to claim 13, wherein adjusting the temperature includes increasing the temperature by heating.

15. A device manufacturing method comprising:
transferring a pattern from a patterning device onto a substrate with a lithographic projection apparatus;
positioning an object within the apparatus with an actuator;
compensating an error caused by thermal expansion of a part of the actuator coupled to the object by heat dissipated by the actuator or by another heat source with a thermal expansion error compensator; and adjusting a temperature of the part of the actuator, wherein adjusting the temperature includes increasing the temperature by heating, wherein the temperature is adjusted by exerting a force by the actuator on the object so that the actuator heats up until an operation temperature is reached and subsequently starting device manufacturing.

16. A thermal compensation system to make a lithographic apparatus less sensitive to temperature changes, the system comprising:

a support constructed to support a substrate in a substrate stage of the lithographic apparatus;

an actuator arranged to position the support or a part thereof; and a thermal expansion error compensator configured to compensate an error caused by thermal expansion of a part of the actuator coupled to the support by any heat dissipated by the actuator or another heat source, wherein the thermal expansion error compensator includes:

a temperature measurement system configured to measure a temperature of the part of the actuator, and a calculator configured to calculate a deformation of the support resulting from the thermal expansion of the part based on the temperature measurement of the part of the actuator.

17. The thermal compensation system according to claim 16, further comprising:

a metrology system configured to control a position, or a shape, or both a position and a shape, of the support and wherein the thermal expansion error compensator is coupled to the metrology system so as to compensate for the error caused by thermal expansion of the part of the actuator.

18. The thermal compensation system according to claim 17, wherein the thermal expansion calculator is coupled to the metrology system to compensate for the error caused by expansion of the substrate caused by the expansion of the part of the actuator.

19. The thermal compensation system according to claim 16, wherein the temperature measurement system is coupled to the part of the actuator coupled to the support.

20. The thermal compensation system according to claim 16, wherein the thermal expansion error compensator includes:

a temperature adjuster configured to adjust the temperature of the part of the actuator coupled to the support.

21. The thermal compensation system according to claim 20, wherein the temperature measurement system is configured to work together with the temperature adjuster to keep the part at a desired temperature.

22. The thermal compensation system according to claim 20, wherein the temperature adjuster is a heater configured to heat the part.

23. A thermal compensation method to make a lithographic apparatus less sensitive to temperature changes, the method comprising:

supporting a substrate in a substrate stage of the lithographic apparatus;

positioning the support or a part thereof with an actuator; and compensating an error caused by thermal expansion of a part of the actuator coupled to the support by any heat dissipated by the actuator or another heat source by:

measuring a temperature of the part of the actuator with a temperature measurement system, and calculating a deformation of the support resulting from the thermal expansion of the part based on the temperature measurement of the part of the actuator.

24. The thermal compensation method according to claim 23, further comprising:

using a metrology system configured to control a position, or a shape, or both a position and a shape, of the support to compensate for the error caused by thermal expansion of the part of the actuator.

25. The thermal compensation method according to claim 23, wherein the temperature measurement system is coupled to the part of the actuator coupled to the support.

26. The thermal compensation method according to claim 23, wherein compensating further comprising:

adjusting the temperature of the part of the actuator coupled to the support to keep the part at a desired temperature.

27. The thermal compensation method according to claim 26, wherein adjusting further comprising:

heating the part of the actuator coupled to the support.

* * * * *